United States Patent [19]

Miyazawa

[11] Patent Number: 5,312,782
[45] Date of Patent: May 17, 1994

[54] SOI TYPE VERTICAL CHANNEL FIELD EFFECT TRANSISTOR AND PROCESS OF MANUFACTURING THE SAME

[75] Inventor: Yoshihiro Miyazawa, Kanagawa, Japan

[73] Assignee: Sony Corporation, Tokyo, Japan

[21] Appl. No.: 795,961

[22] Filed: Nov. 21, 1991

[30] Foreign Application Priority Data

Nov. 23, 1990 [JP] Japan .................................. 319596
Nov. 23, 1990 [JP] Japan .................................. 319597
Nov. 24, 1990 [JP] Japan .................................. 319398

[51] Int. Cl.[5] .................... H01L 21/02; H01L 29/68
[52] U.S. Cl. ................................. 437/235; 437/62;
437/66; 437/67; 437/69; 437/72; 437/79;
437/84; 437/43; 437/913; 257/330; 257/333;
257/347; 257/353
[58] Field of Search .................. 357/23.4, 23.6 G;
437/62, 66, 67, 69, 72, 79, 84, 235, 913, 43;
257/330, 333, 347, 353

[56] References Cited

U.S. PATENT DOCUMENTS 4,523,963  6/1985  Ohta et al. .
5,072,269  12/1991  Hieda .................. 357/23.4

FOREIGN PATENT DOCUMENTS 0166003  1/1986  European Pat. Off. .
0377084  7/1990  European Pat. Off. .
63-40376  2/1988  Japan .

*Primary Examiner*—Edward Wojciechowicz
*Attorney, Agent, or Firm*—Hill Steadman & Simpson

[57] ABSTRACT

A thin film field effect transistor manufactured using a cladding technique wherein parasitic capacities of the source and drain with respect to the ground are low and a substrate biasing effect is low. The vertical channel field effect transistor comprises a substrate, an insulating layer formed on the substrate, and a semiconductor layer formed on the substrate in the insulating layer. The semiconductor layer has one of a source and a drain and an electrode for the one of the source and drain formed at a lower portion thereof while the other of the source and drain and another electrode for the other of the source and drain are formed at an upper portion of the semiconductor layer. The semiconductor layer further has a groove formed therein, and a gate electrode formed in the groove to fill up the same. Several processes of manufacturing such vertical channel field effect transistor are also disclosed.

2 Claims, 23 Drawing Sheets

FIG. 9
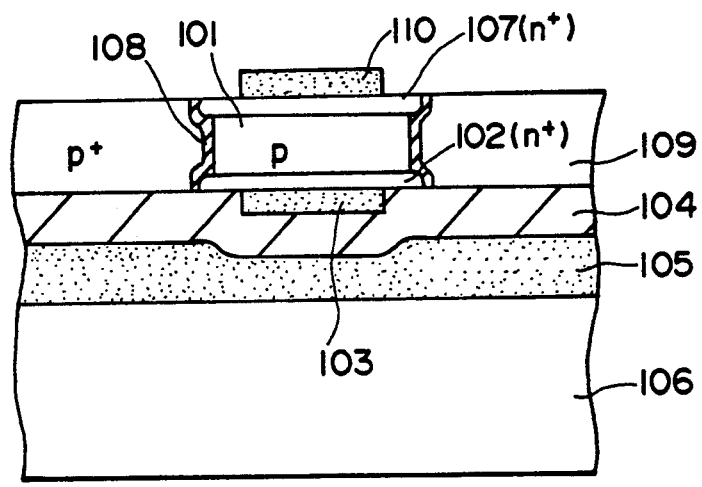
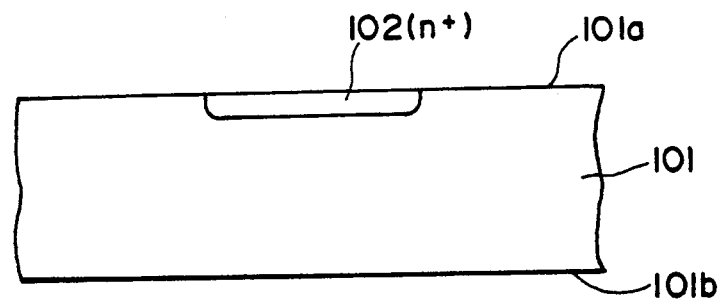
FIG. 10A
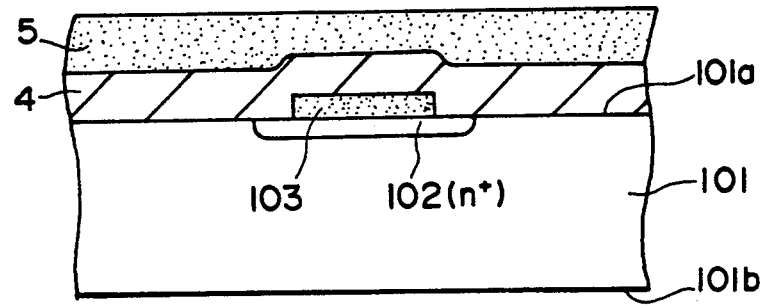
FIG. 10B

SOI TYPE VERTICAL CHANNEL FIELD EFFECT TRANSISTOR AND PROCESS OF MANUFACTURING THE SAME

BACKGROUND OF THE INVENTION

1. Field of the Invention

This invention relates to a vertical channel FET (field effect transistor) formed on an insulating film using a cladding technique, and more particularly to a vertical channel FET which is easy to manufacture in fine structure, and also to a process of manufacturing such vertical channel FET and a semiconductor memory which employs such vertical channel FET and has improved electric characteristics.

2. Description of the Prior Art

An FET which is commonly used as a device for an integrated circuit is constructed such that a channel extends in parallel to a front surface of a substrate and a sum total of areas of the source, drain and channel makes an occupied area of the FET device. Accordingly, fine structure is difficult with such FET.

An exemplary one of such FETs is disclosed, for example, in Japanese Patent Laid-Open Application No. 63-40376 and shown in FIGS. 1 and 2. Referring to FIGS. 1 and 2, a gate electrode 2 is formed on an insulator 1, and a gate insulator 3 is formed on an outer circumference of the gate electrode 2. A source (or drain) 5 of an N-type semiconductor, a P-type semiconductor 6 and a drain (or source) 7 of an N-type semiconductor are formed in this order from above such that they surround the gate insulator 3, and an N-type channel 4 is formed in the semiconductor 6 adjacent the gate insulator 3 by controlling a voltage to the gate electrode 2.

Since the channel 4 is formed on the entire outer circumference of the gate electrode 2 in a vertical direction as apparently seen from FIG. 1, such transistors have a high mutual conductance.

In such conventional vertical FET as described above, either one of the source and drain is positioned at the bottom, and accordingly, when a large number of vertical channel FETs are to be formed on an integrated circuit and wired to each other, either one of the source and drain of each of such vertical channel FETs which is positioned at the bottom must be led out to a front surface of the semiconductor device. Accordingly, such conventional vertical FET is restricted in improvement in fine structure.

Further, parasitic capacities of the source and drain with respect to a substrate are significantly high, and also a substrate biasing effect is high.

Besides, it is difficult to sufficiently reduce the thickness of a portion of semiconductor on which a channel is to be formed in a depthwise direction of the channel.

OBJECTS AND SUMMARY OF THE INVENTION

It is an object of the present invention to provide a thin film FET manufactured using a cladding technique wherein parasitic capacities of the source and drain with respect to the ground are low and a substrate biasing effect is low.

It is another object of the present invention to provide a process of manufacturing a thin film FET wherein parasitic capacities of the source and drain with respect to the ground are low and a substrate biasing effect is low.

It is a further object of the present invention to provide a process of manufacturing a vertical channel FET wherein a portion of a semiconductor layer in which a channel is formed has a reduced thickness in the depthwise direction of the channel.

It is a still further object of the present invention to provide a vertical channel FET which is fine in structure.

In order to attain the objects, according to an aspect of the present invention, there is provided a vertical channel field effect transistor which comprises a substrate, an insulating layer formed on the substrate, and a semiconductor layer formed on the substrate in the insulating layer, the semiconductor layer having one of a source and a drain and an electrode for the one of the source and drain formed at a lower portion thereof while the other of the source and drain and another electrode for the other of the source and drain are formed at an upper portion of the semiconductor layer.

With the vertical channel field effect transistor, the source and drain and the channel between them do not occupy individual spaces, and one of the source electrode and drain electrode which is formed at the lower portion of the semiconductor layer is not led out to a front surface of the semiconductor layer. Accordingly, the vertical channel field effect transistor can be made small.

Besides, the length of the gate is determined by a thickness of the semiconductor layer or a vertical distribution in concentration of an impurity in the thickness, and accordingly, it can be reduced beyond a limit of photo-lithography.

According to another aspect of the present invention, there is provided a vertical channel field effect transistor which comprises a substrate, an insulating layer formed on the substrate, a semiconductor layer formed on the substrate in the insulating layer, the semiconductor layer having one of a source and a drain formed at a lower portion thereof while the other of the source and drain is formed at an upper portion of the semiconductor layer, the semiconductor layer having a groove formed therein, and a gate electrode formed in the groove to fill up the same.

In addition, the width of the gate can be defined by circumferential lengths of the grooves and the thickness of the gate can be defined by shapes and sizes of the grooves. Accordingly, characteristics of the vertical channel field effect transistor can be controlled with a high degree of accuracy.

According to a further aspect of the present invention, there is provided a process of manufacturing a vertical channel field effect transistor, which comprises the steps of selectively etching a semiconductor layer from one of a pair of main surfaces thereof to form a groove on an outer side of a portion of the semiconductor layer which is to make a channel later, selectively etching the semiconductor layer from the other main surface thereof to form another groove on an inner side of the portion of the semiconductor layer which is to make a channel, filling up the groove on the outer side of the channel to make a channel with an insulating film, and filling up the groove on the inner side of the portion to make a channel with a gate electrode film.

With the manufacturing process, a vertical channel field effect transistor can be manufactured wherein an insulating film is positioned on an outer side of a channel while a gate electrode is positioned on an inner side of the channel, and the vertical channel can be formed by decreasing the distance between the groove in which the insulating film is filled and the groove in which the gate electrode is filled. Accordingly, the length of the channel can be reduced significantly by making the semiconductor layer thin, and the thickness of the channel portion in the depthwise direction of the channel portion can be reduced significantly.

Further, such vertical channel field effect transistor does not have anything which corresponds to a semiconductor substrate in the case of a bulk MOS FET but has an insulating film. Accordingly, a thin film field effect transistor can be obtained wherein the source and drain have low parasitic capacities and a substrate biasing effect is low.

According to a still further aspect of the present invention, there is provided a process of manufacturing a vertical channel field effect transistor, which comprises the steps of etching a field effect transistor formation region of a semiconductor layer surrounded by an insulating film by a suitable thickness from one of a pair of surfaces of the semiconductor layer to form a stepped portion on the semiconductor layer, forming a side wall on an inner side surface of the stepped portion, etching the field effect transistor formation region of the semiconductor layer using the side wall as a mask to form a channel portion which extends in a vertical direction, and forming a gate electrode in the thus etched region.

With the manufacturing method, since a vertical channel field effect transistor is manufactured which has an insulating film formed around a field effect transistor formation region but does not include anything which corresponds to a substrate in the case of a bulk MOS transistor, it has low parasitic capacities of the source and drain and has a low substrate biasing effect.

Further, since a semiconductor portion which is to make a vertical channel is formed by etching of a field effect transistor formation region using a side wall as a mask, the thickness of the semiconductor portion which is to make a channel in the direction of the thickness of the channel can be controlled in accordance with the thickness of the side wall. And, since the thickness of the side wall can be made small beyond a limit of photolithography, the semiconductor portion to make a channel can be made thin beyond a limit of photo-lithography and improvement in resistance to a software error can be achieved.

The above and other objects, features and advantages of the present invention will become apparent from the following description and the appended claims, taken in conjunction with the accompanying drawings.

BRIEF DESCRIPTION OF THE DRAWINGS

FIG. 9 is a schematic vertical sectional view of another vertical channel FET according to a fifth preferred embodiment the present invention;

FIGS. 10A to 10H are schematic sectional views showing successive different steps of a process of manufacturing the vertical channel FET shown in FIG. 9 according to a sixth preferred embodiment of the present invention;

DESCRIPTION OF THE PREFERRED EMBODIMENTS

Referring first to FIGS. 3A to 3H, there are shown successive different steps of a process of manufacturing a vertical channel FET according to a first preferred embodiment of the present invention.

Figure 1:
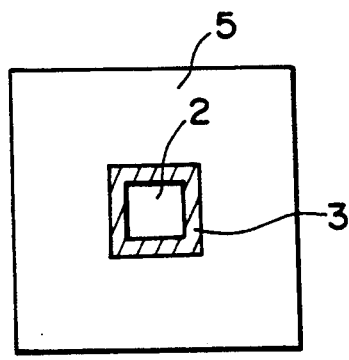
FIG. 1 is a plan view of a conventional vertical channel FET formed on an insulator.
Figure 2:
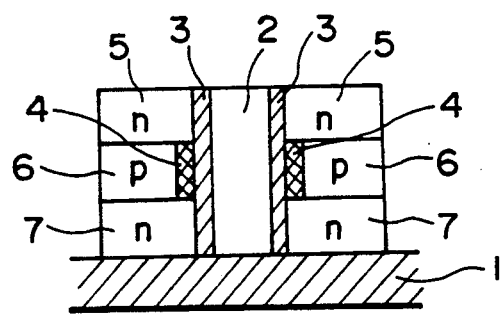
FIG. 2 is a schematic sectional view showing structure of the vertical channel FET of FIG. 1.
Figure 3A:
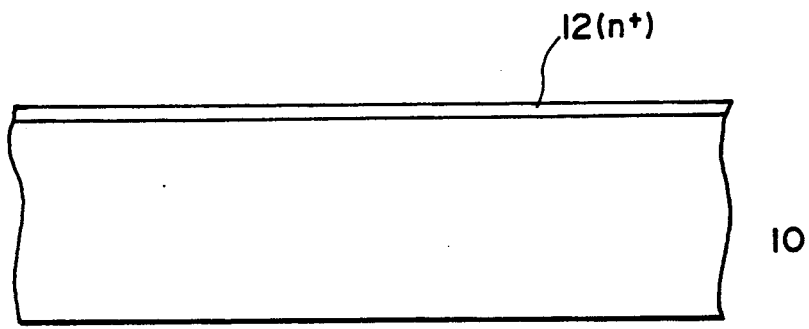
FIGS. 3A to 3H are schematic sectional views showing successive different steps of a process of manufacturing a vertical channel FET using an SOI (silicon on insulator) according to a first preferred embodiment of the present invention.

(A) In particular, first a semiconductor substrate 10 which is to make an SOI (silicon on insulator) layer is prepared and an n-type impurity is doped into a portion of a front surface or an entire front surface of the semiconductor substrate 10 to form an n+-type drain 12 as shown in FIG. 3A. While in the present embodiment the drain 12 is formed on the entire front surface of the semiconductor substrate 10, it need not naturally be formed in this manner, but may otherwise be selectively formed at portions of the front surface of the semiconductor substrate 10 which are to remain as drains 12 at a final stage.

Figure 3B:
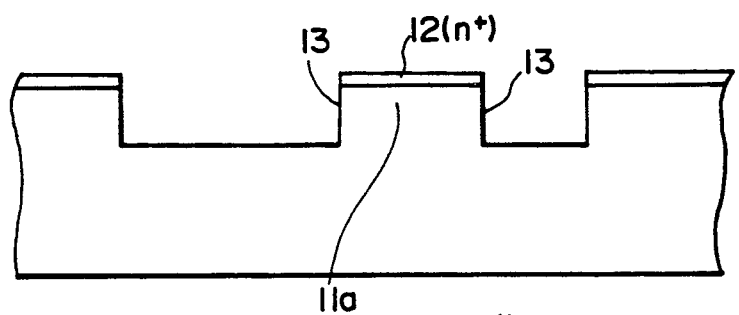

(B) Subsequently, the front surface of the semiconductor substrate 10 is selectively etched to form a groove 13 as shown in FIG. 3B. An FET will be formed at a portion 11a surrounded by the groove 13, and an outer peripheral surface of the portion 11a will be a surface of a channel of the FET remote from a gate. Accordingly, the position of the surface of the channel remote from the gate is determined by such selective etching. Further, the length of the channel is almost determined by a depth of such etching. It is to be noted that the groove 13 corresponds to a groove on the outer side of the semiconductor portion 11a which makes a channel as defined in claim 1.

Figure 3C:
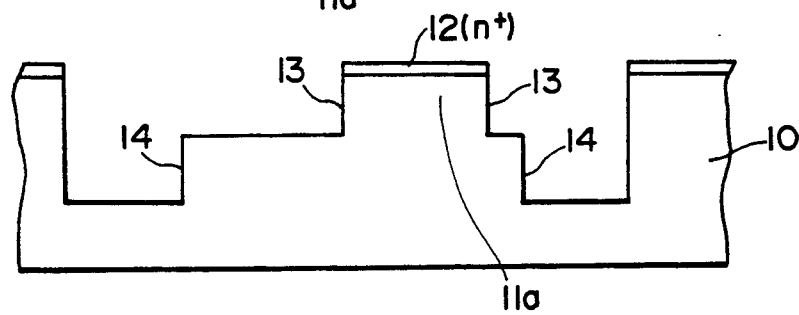

(C) Subsequently, the front surface of the semiconductor substrate 10 is selectively etched in a different pattern to form another groove 14 deeper than the groove 13 as shown in FIG. 3C. A difference in depth between the grooves 14 and 13 substantially corresponds to the thickness of a source.

Figure 3D:
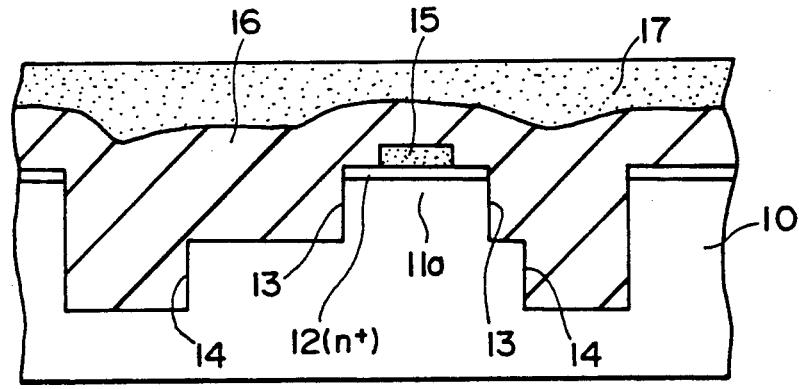

(D) Subsequently, a drain electrode 15 made of, for example, polycrystal silicon or a metal of a high melting point is formed on the drain 12, and then an insulating film 16 is formed. In this instance, the insulating film 16 is formed such that it fills up the grooves 13 and 14 and fully covers over the drain electrode 15. Then, a polycrystal silicon layer 17 for cladding is formed on the insulting film 16. FIG. 3D shows a condition after formation of the polycrystal silicon layer 17 for cladding.

Figure 3E:
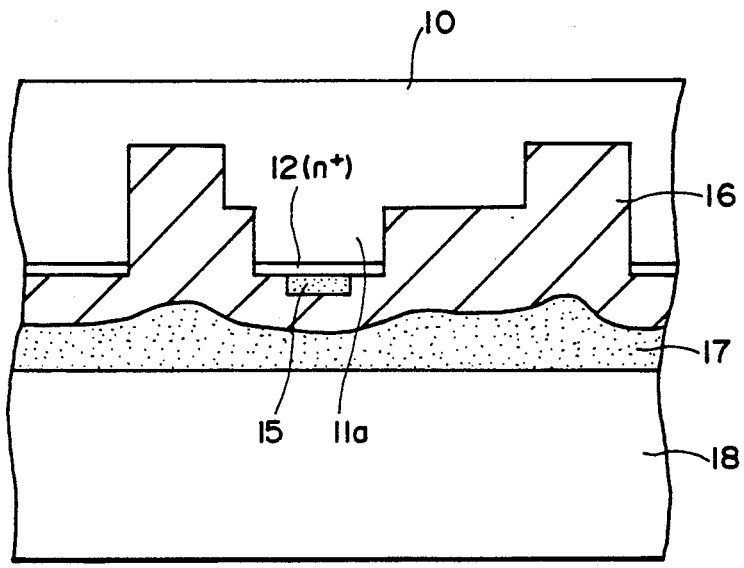

(E) Subsequently, the semiconductor substrate 10 is clad at a front surface of the polycrystal silicon layer 17 thereon to a front surface of another semiconductor substrate 18 as shown in FIG. 3E. This corresponds to a substrate in regard to mechanical strength of the present FET.

(F) Subsequently, a rear surface of the semiconductor substrate 10 is removed by polishing or etching until the insulating film 16 is exposed outside. As a result, the semiconductor substrate 10 is changed into an SOI layer 11a. It is to be noted that reference character 11b denotes a surface produced by polishing or the like of the rear surface of the semiconductor substrate 10 and accordingly it can be regarded as a front surface of the SOI layer 11a. Accordingly, the surface 11b will be hereinafter referred to as a front surface of the SOI layer 11a.

Figure 3F:
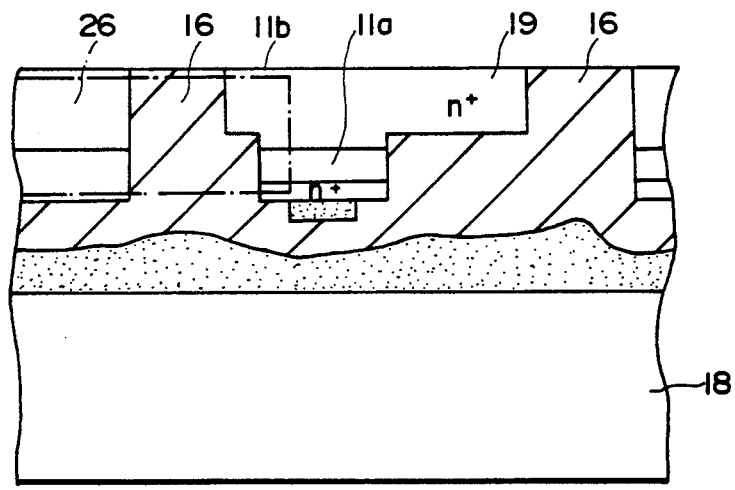

Then, an n-type impurity is doped into the front surface of the SOI layer 11a to form a source 19. FIG. 3F shows a condition after formation of the source 19.

Figure 3G:
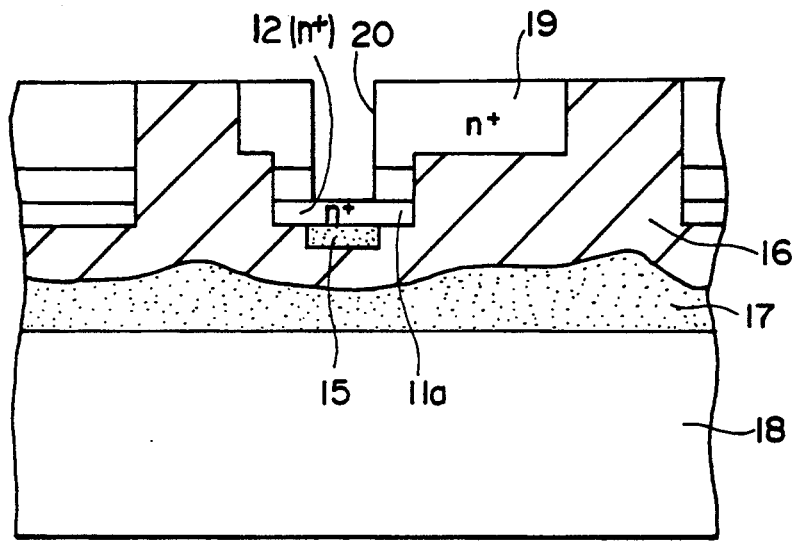

(G) Subsequently, the SOI layer 11a is selectively etched from the front surface 11b side thereof to form a groove 20 as shown in FIG. 3G. Since a gate electrode is filled into the groove 20 at a next step, the etching determines the position of a surface of the gate electrode adjacent the channel. In other words, the groove 20 corresponds to a groove on the inner side of a portion which makes a channel as defined in claim 1.

Figure 3H:
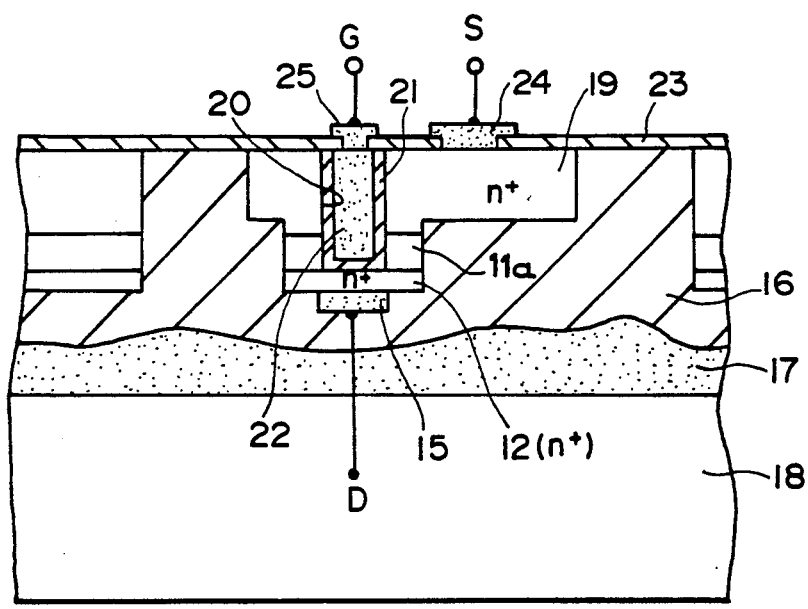

(H) Then, a gate insulating film 21 made of SiO₂ is formed on an inner surface of the groove 20 by oxidation by heating or the like, and the groove 20 is filled with polycrystal silicon to form a silicon gate electrode 22. Then, and insulating film 23 is formed on the front surface of the SOI layer 11a, and then contact holes are formed by selective etching, whereafter a source electrode 24 and a gate wiring film 25 made of, for example, polycrystal silicon are formed. Consequently, such a vertical channel FET as shown in FIG. 3H is obtained.

According to such process of manufacturing a vertical channel FET as described above, the length of the channel can be reduced by reducing the thickness of the SOI layer, and besides the FET is surrounded by the insulating film 16 but does not have anything which corresponds to a semiconductor substrate of a bulk MOS FET. Or, the insulating film may correspond to such semiconductor substrate. Accordingly, the parasitic capacities of the source and drain with respect to the ground are reduced significantly, and also a substrate biasing effect can be reduced significantly.

Further, the thickness of the channel portion in a depthwise direction of the channel can be reduced, and the resistance to a soft error can be improved.

Figure 4A:
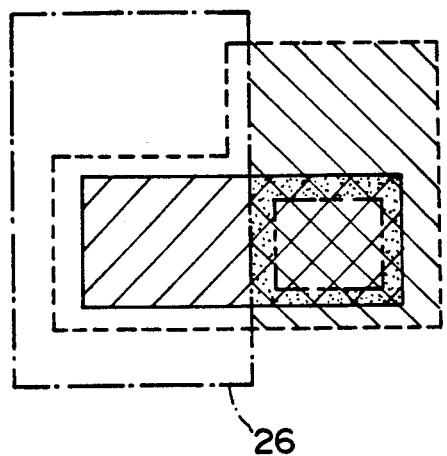
FIGS. 4A and 4B are plan views showing exemplary layouts of a vertical channel FET manufactured by the process shown in FIGS. 3A to 3H.
Figure 4B:
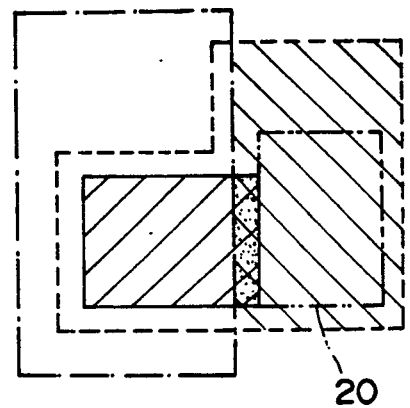

It is to be noted that, according to the present process of manufacturing a vertical channel FET, while the thickness of the SOI layer 11a can be reduced in the depthwise direction of the channel, there is the possibility that it may become difficult to provide electrodes of the source and drain. Thus, at the step of FIG. 3F, another step of etching the SOI layer 11a may be added to remove a portion 26 indicated by an alternate long and short dash line devising the layout. FIGS. 4A and 4B show different arrangements to which such device in layout is provided. It is to be noted that, while upper portions of the alternate long and short dash lines in FIGS. 4A and 4B should each be positioned at the same height as the front surface 11b, they are indicated in a somewhat downwardly displaced condition so as to eliminate overlapping of lines to facilitate understanding.

Referring to FIGS. 4A and 4B, each solid line indicates a boundary of an n+-type drain 12 which is indicated by rightwardly upwardly inclined hatching lines. An alternate long and two short dashes line indicates a boundary of a region (groove 20) to which etching (refer to FIG. 3G) is performed to form a gate electrode. Each alternate long and short dash line indicates a boundary of a region 26 removed by etching added to the step of FIG. 3F. In each of FIGS. 4A and 4B, a region indicated by a matte finish pattern and defined by the boundary of the region 26, the boundary of the drain 12 and the boundary of the region indicated by an alternate long and two short dashes line for which etching is performed to form a gate electrode will make a channel. Each broken line indicates a boundary of a region to be etched at the step C shown in FIG. 3C. A region indicated by rightwardly downwardly inclined hatching lines and defined by the boundary of such region and the boundary indicated by the alternate long and short dash line is a region in which a source electrode can be formed.

FIG. 4A shows an arrangement wherein a channel is formed in a ring-like shape along an entire periphery of a gate electrode while FIG. 4B shows another arrangement wherein a channel is formed like a flat plate on a side of a gate electrode. It is to be noted that the structure shown in FIG. 4B can be applied not only to formation of a MOS FET but also to vertical electrode connecting wiring (through-holes) to interconnect an upper electrode and a lower electrode through a portion corresponding to a channel.

Referring now to FIGS. 5A to 5K, there are shown different successive steps of a process of manufacturing a vertical channel FET according to a second preferred embodiment of the present invention.

Figure 5A:
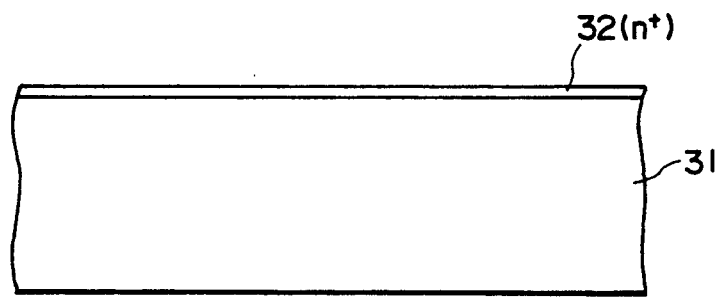
FIGS. 5A to 5K are schematic sectional views showing successive different steps of another process of manufacturing a vertical channel FET according to a second preferred embodiment of the present invention.

(A) First, a semiconductor substrate 31 which is to make an SOI layer is prepared and an n-type impurity is doped into a front surface of the semiconductor substrate 31 to form a drain 32 as shown in FIG. 5A.

Figure 5B:
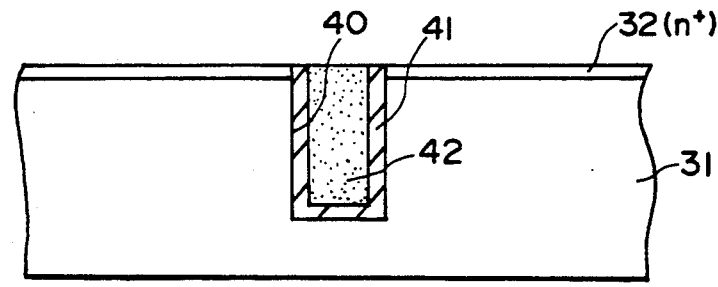

(B) Then, the front surface of the semiconductor substrate 31 is selectively etched to form a groove 40, and a surface of the groove 40 is oxidized by heating to form a gate insulating film 41. After then, the groove 40 is filled with a gate electrode 42 made of polycrystal silicon. FIG. 5B shows a condition after formation of the gate electrode 42.

Figure 5C:
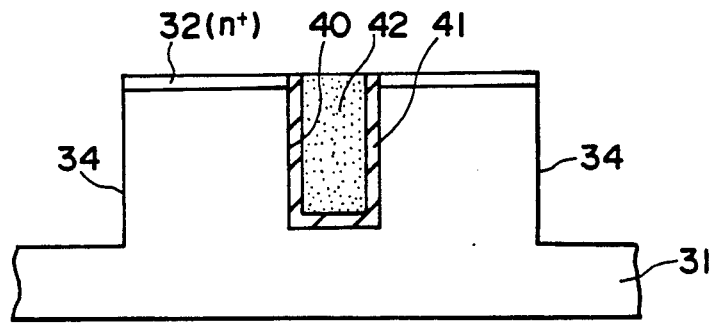

(C) Subsequently, the front surface of the semiconductor substrate 31 is selectively etched to form another groove 34 as shown in FIG. 5C.

Figure 5D:
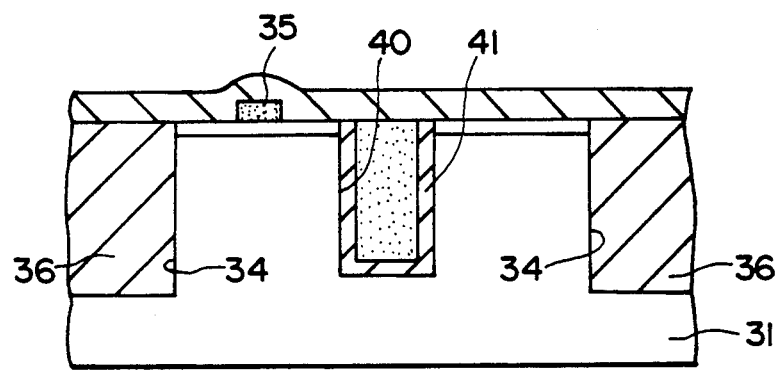

(D) Then, a drain electrode 35 made of polycrystal silicon is formed on the drain 32, and then the groove 34 is filled and the drain electrode 35 is covered with an insulating film 36. FIG. 5D shows a condition after formation of such insulating film 36.

Figure 5E:
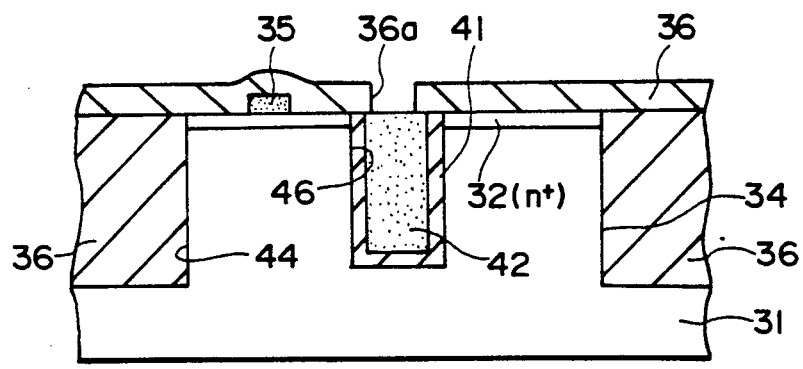

(E) Then, a contact hole 36a for exposing the gate electrode 42 outside therethrough is formed in the insulating film 36 as shown in FIG. 5E.

Figure 5F:
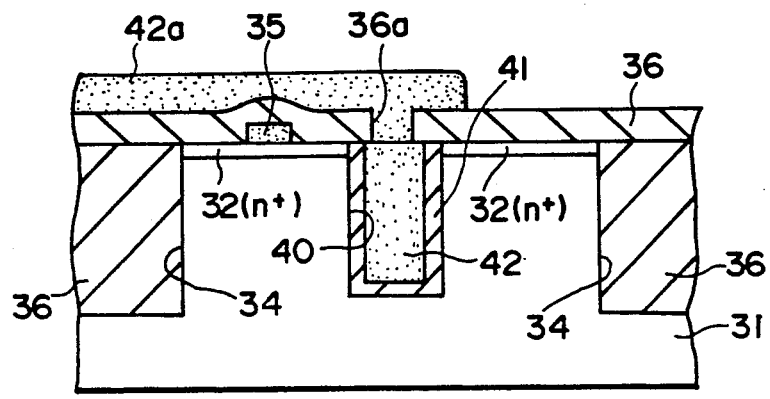

(F) Subsequently, a gate wiring film 42a is formed as shown in FIG. 5F.

Figure 5G:
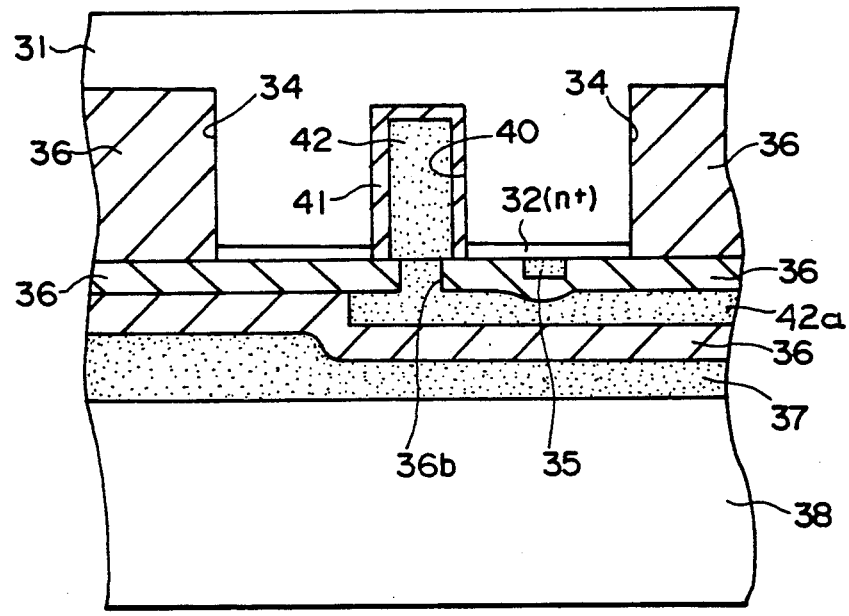

(G) Then, another insulating film 36, for covering over the gate wiring film is formed and a polycrystal silicon layer 37 for cladding is formed, whereafter the semiconductor substrate 31 is clad at a front surface of the polycrystal silicon layer 37 for cladding thereon to a front surface of another semiconductor substrate 38. FIG. 5G shows after such cladding of the semiconductor substrates.

Figure 5H:
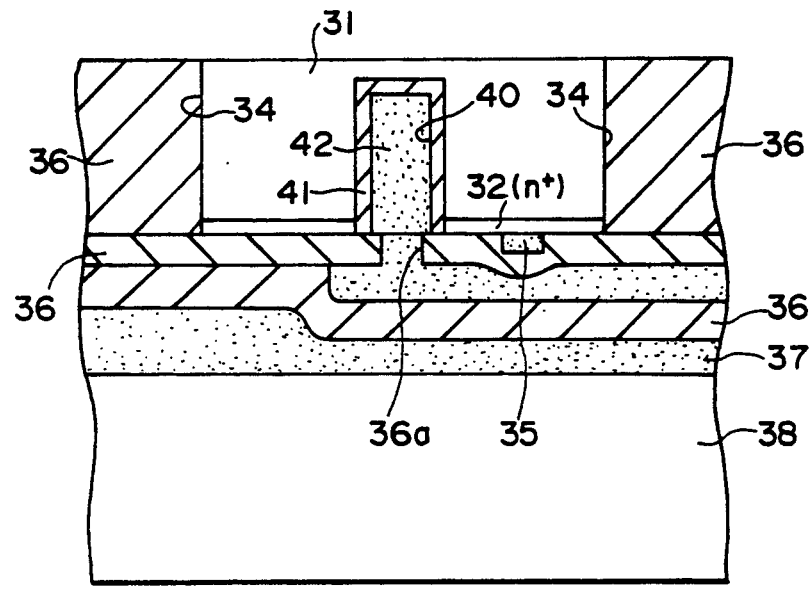

(H) Subsequently, a rear surface of the semiconductor substrate 31 is polished until the insulating film 36 is exposed as shown in FIG. 5H. Consequently, the semiconductor substrate 31 makes an SOI layer.

Figure 5I:
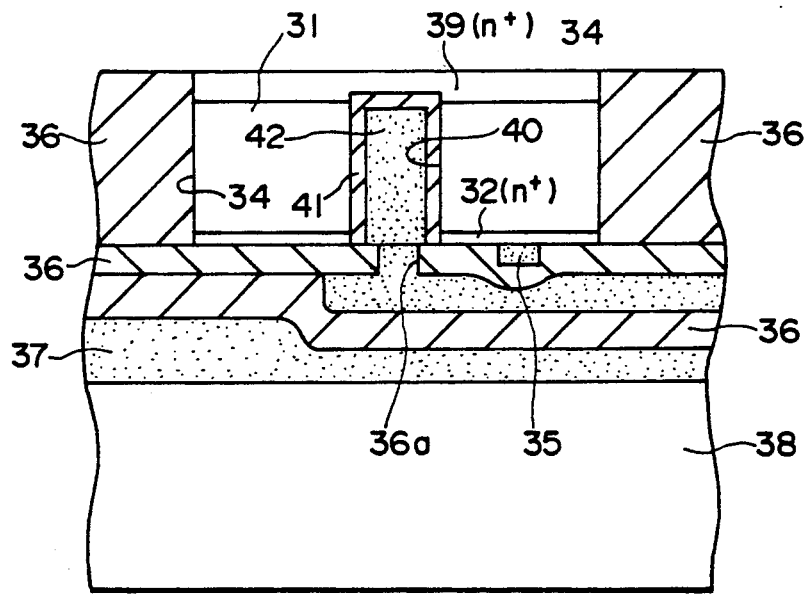

(I) Subsequently, an n-type impurity is doped into the semiconductor substrate 31 to form an n+-type source 39 as shown in FIG. 5I.

Figure 5J:
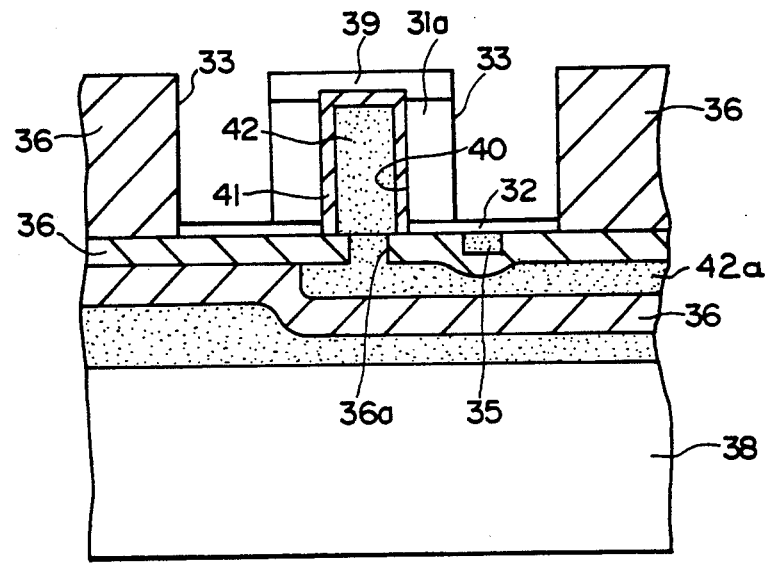

(J) Then, etching is performed to reduce the thickness of the SOI layer 31a in the depthwise direction of a channel to form a groove 33 as shown in FIG. 5J. Consequently, a surface of the channel remote from the gate electrode is defined.

Figure 5K:
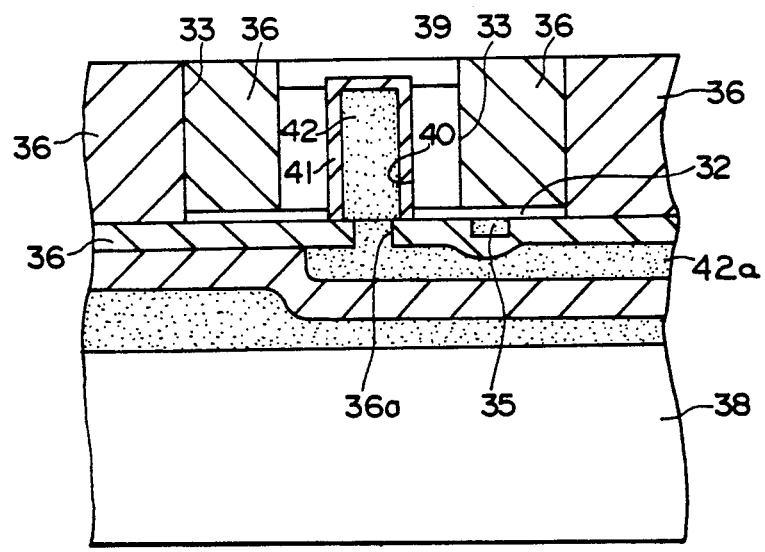

(K) Subsequently, the groove 33 is filled as shown in FIG. 5K.

Then, a source electrode is formed in a similar manner as in the embodiment shown in FIGS. 3A to 3H. Consequently, a vertical channel FET having a gate wire on a lower side thereof is completed.

Referring now to FIGS. 6A to 6L, there are shown successive different steps of a process of manufacturing a vertical channel FET according to a third preferred embodiment of the present invention.

Figure 6A:
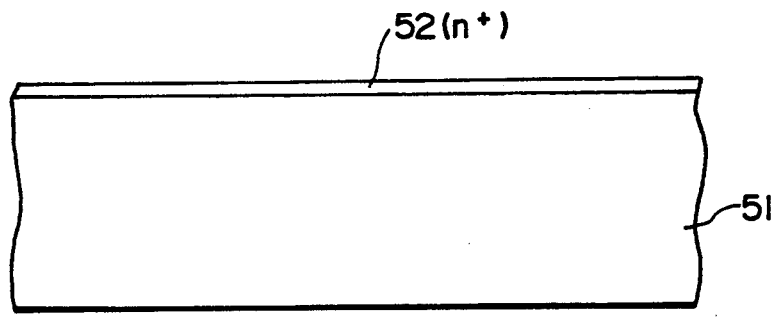
FIGS. 6A to 6L are schematic sectional views showing successive different steps of a further process of manufacturing a vertical channel FET according to a third preferred embodiment of the present invention.

(A) First, a semiconductor substrate 51 which is to make an SOI layer 51a later is prepared and an n-type impurity is doped into a portion of a front surface or an entire front surface of the semiconductor substrate 51 to form an n+-type drain 52 as shown in FIG. 6A. It is to be noted that the drain may otherwise be selectively formed only at a portion of the front surface of the semiconductor substrate 51 which is to remain as a drain 52 at a final stage.

Figure 6B:
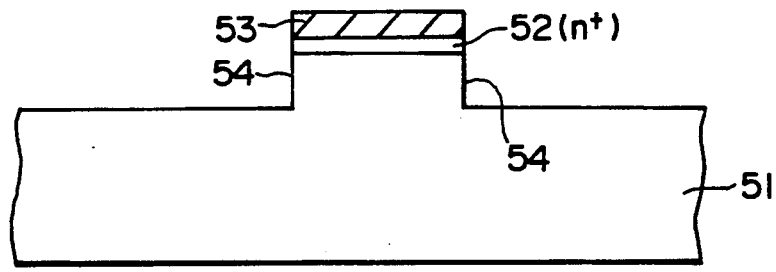

(B) Subsequently, an insulating film 53 made of SiO$_2$ is selectively formed on the front surface of the semiconductor substrate 51, and the front surface of the semiconductor substrate 51 is etched to form a groove 54 as shown in FIG. 6B using the insulating film 53 as a mask.

Figure 6C:
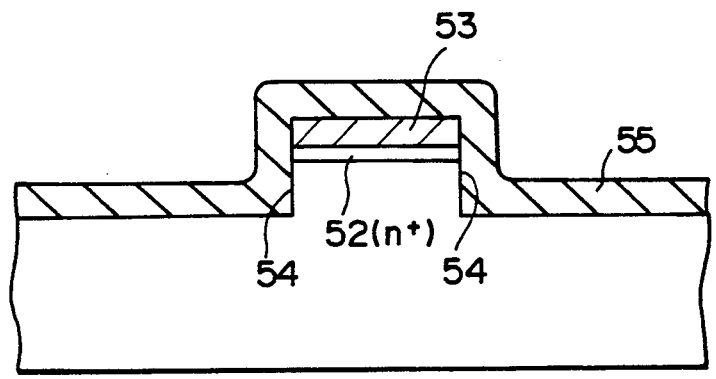

(C) Subsequently, an insulating film 55 for formation of a side wall is formed on the semiconductor substrate 51 as shown in FIG. 6C by a CVD (chemical vapor deposition) method.

Figure 6D:
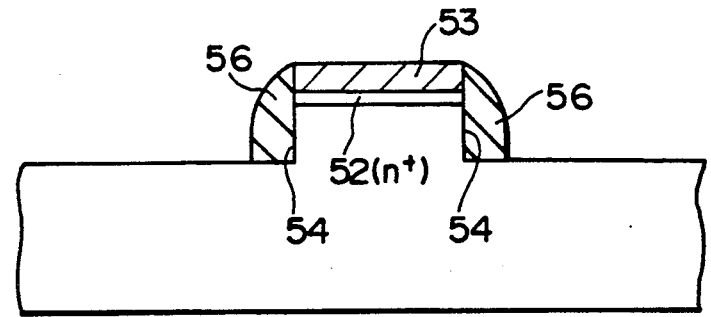

(D) Then, a side wall 56 is formed on an inner side surface of the groove 54 as shown in FIG. 6D by anisotropic etching of the insulating film 55. It is to be noted that the insulating film 53 used as an etching mask at step B described above acts to protect a front surface of the drain 52 of the semiconductor substrate 51, which is to make an SOI layer, from being etched.

Figure 6E:
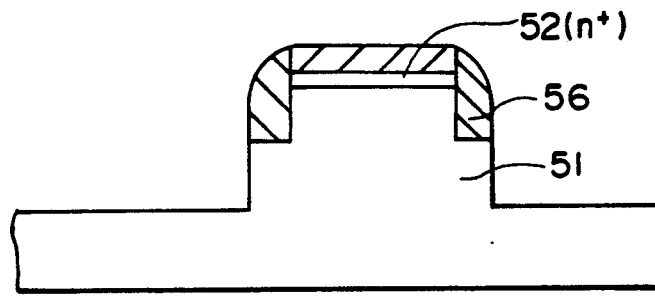

(E) Subsequently, the semiconductor substrate 51 is etched further deeply as shown in FIG. 6E using the side wall 56 as a mask.

Figure 6F:
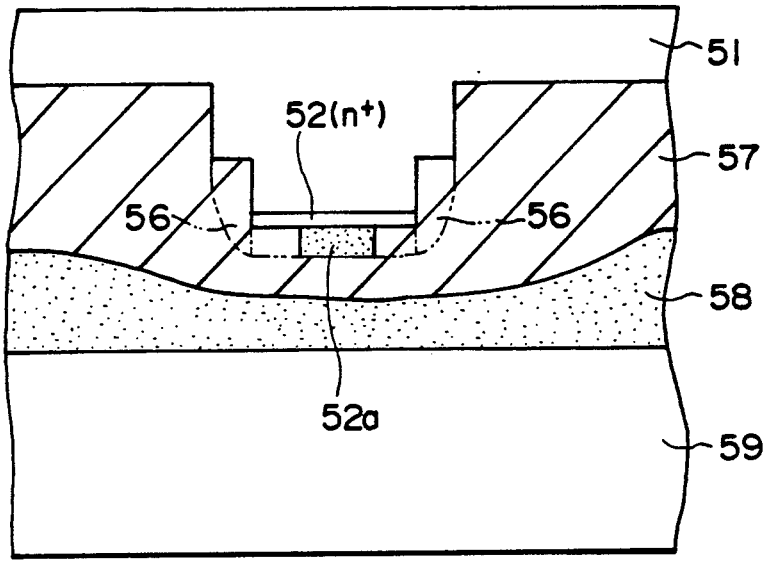

(F) Subsequently, the insulating film 53 on the source 52 is removed and a source electrode 52a made of, for example, polycrystal silicon is formed on the source 52, and then an insulating film 57 is formed on the entire front surface of the semiconductor substrate 51 by a CVD method. Further, a polycrystal silicon layer 58 for cladding of semiconductor wafer is formed on a front surface of the insulating film 57 by a CVD method, and the semiconductor substrate 1 is clad at a front surface of the polycrystal silicon layer 58 thereon to a front surface of another semiconductor substrate 59. The semiconductor substrate 59 corresponds to a substrate of the present vertical channel FET in structural and mechanical senses. FIG. 6F shows a condition after formation of the polycrystal silicon layer 17 for cladding wherein the semiconductor substrate 59 is at the bottom and a rear surface of the semiconductor substrate 51 is at the top.

Figure 6G:
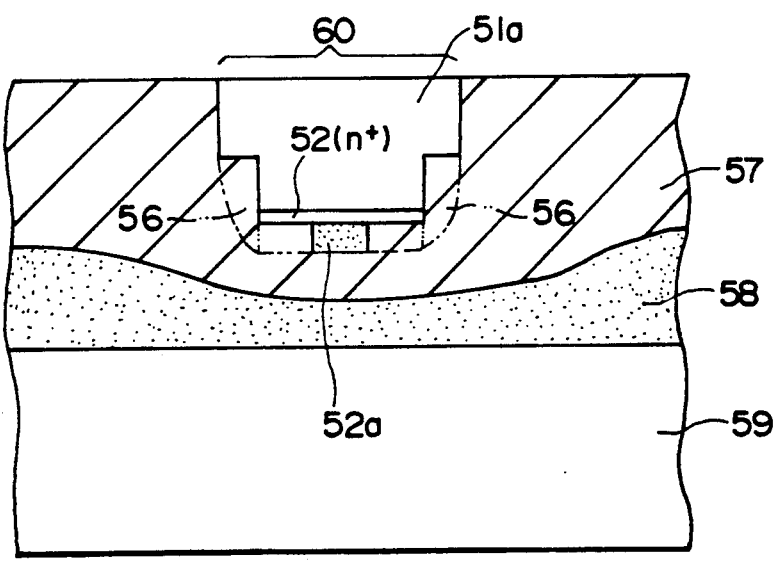

(G) Subsequently, the rear surface of the semiconductor substrate 51 is polished until a front surface of the insulating film 57 is exposed outside as shown in FIG. 6G. Consequently, the semiconductor substrate 51 makes an SOI layer 51a. While the SOI layer 51a provides a plurality of FET formation regions isolated from one another by the insulating film 57, only one of such FET formation regions is shown in FIG. 6G. Then, the polished surface which is the rear side of the semiconductor substrate 51 makes a front surface of the SOI layer 51a.

Figure 6H:
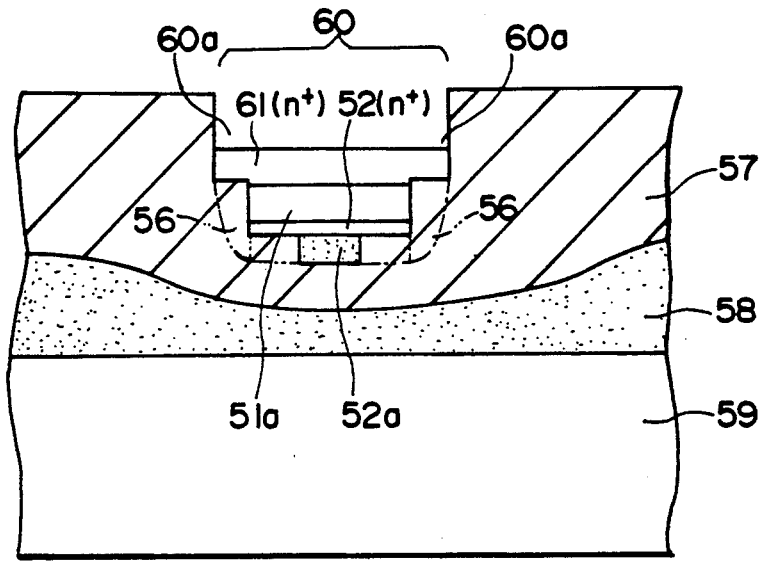

After then, an n-type impurity is doped into the front surface of the SOI layer 51a to form an n+-type source 61. FIG. 6H shows a condition after formation of the source 61.

Figure 6I:
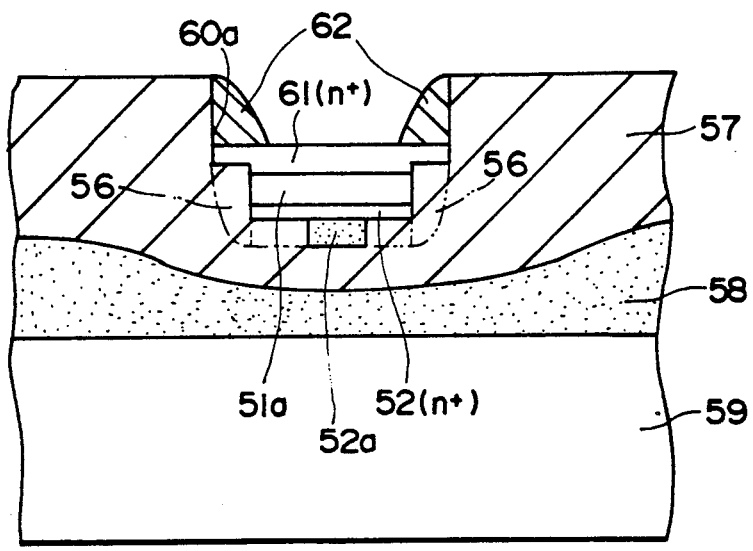

(I) Subsequently, a side wall 62 is formed on an inner side surface of the stepped portion 50a as shown in FIG. 6I. The thickness of the side wall 62 must be suitably greater than that of the side wall 56. This is because, while it will become clear later, a value of difference of the thickness of the side wall 56 from the thickness of the side wall 62 makes a thickness of a vertical channel portion (thickness in the depthwise direction of a channel).

Figure 6J:
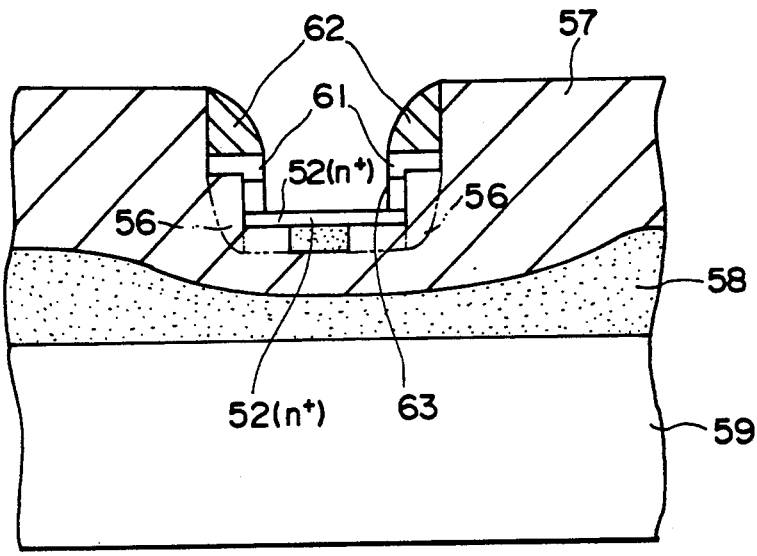

(J) Then, a front surface of the FET formation region 60 of the SOI layer 51a is etched so deeply as to allow the source 52 to remain as shown in FIG. 6J using the side wall 62 as a mask. Consequently, a vertical channel is formed.

Figure 6K:
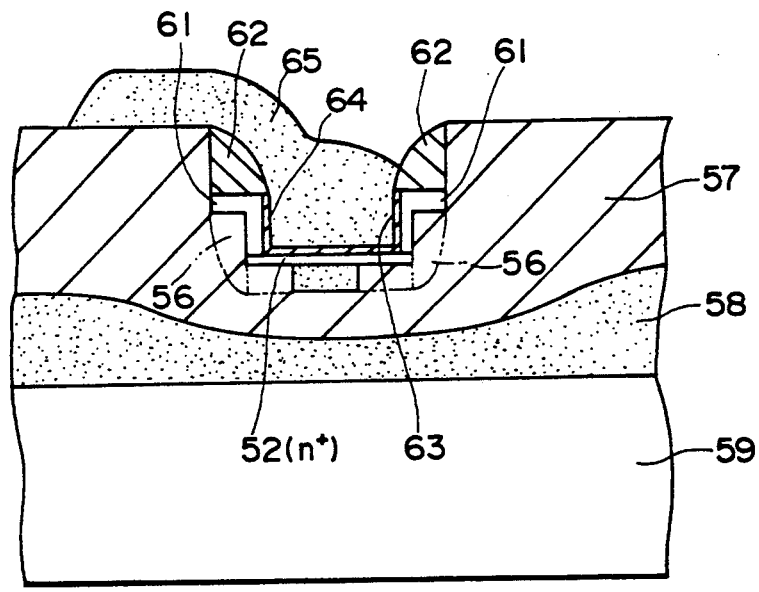
Figure 6L:
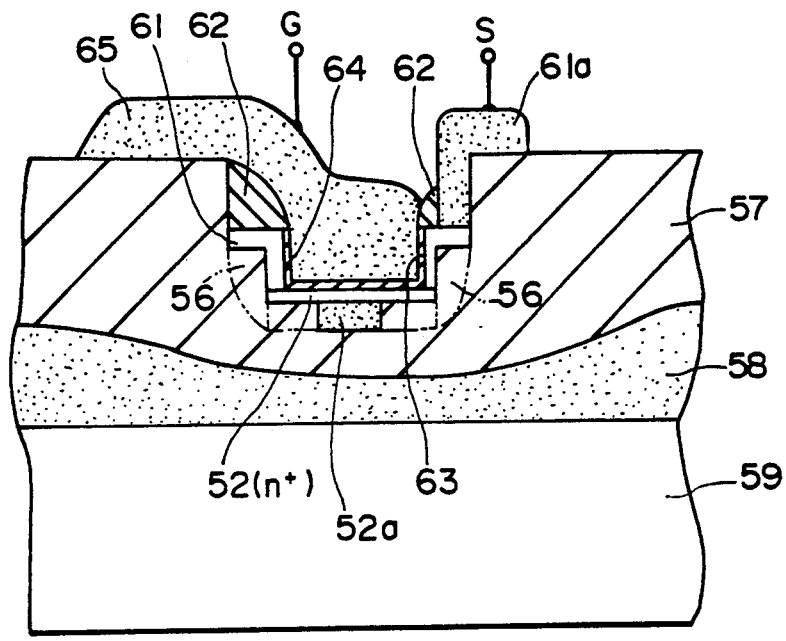

(K) Subsequently, the front surface of the SOI layer 51a is oxidized to form a gate insulating film 64, and then a gate electrode 65 made of, for example, polycrystal silicon is formed as shown in FIG. 6K.

(L) After then, the side wall 62 is selectively etched to form an opening, and a drain electrode 61a made of polycrystal silicon is formed.

According to such process of manufacturing a vertical channel FET as described above, an FET formation portion is surrounded at a peripheral edge and a bottom surface thereof by the insulating film 57 but does not have such a thing which corresponds to a semiconductor substrate of a bulk MOS FET. Accordingly, the parasitic capacities of the source and drain with respect to the ground can be reduced significantly.

Further, the thickness of a portion of semiconductor, at which the vertical channel is formed, in a depthwise direction of the channel can be reduced beyond a limit of a technique of photo-lithography. This is because a value of difference of the thickness of the side wall 56 from the thickness of the side wall 62 makes a thickness of the vertical channel portion and each of the thickness values of the side walls 56 and 62 can be controlled with a high degree of accuracy beyond a limit of photo-lithography in accordance with a height of a side surface on which the side wall 56 or 62 is formed.

In particular, an inner side surface of the side wall 56 is determined by the selective etching step shown in FIG. 6B and makes an outer side surface of a portion which makes a channel. Then, an inner side surface of the portion to make a channel is provided by a surface displaced inwardly by a distance equal to the thickness of the side wall 62 from another surface which is displaced outwardly by a distance equal to the thickness of the side wall 56 from the outer side surface of the portion to make a channel, and accordingly, the thickness of the portion to make a channel is equal to a difference in thickness between the side walls 62 and 56. Accordingly, the thickness of the portion to make a channel can be made very small without depending upon photo-lithography.

Referring now to FIGS. 7A to 7G, there shown successive different steps of a process of manufacturing a vertical channel FET according to a fourth preferred embodiment of the present invention. In the present embodiment, a lead to a drain electrode is facilitated, or more particularly, a wide area is assured for a region from which a drain electrode can be led out.

Figure 7A:
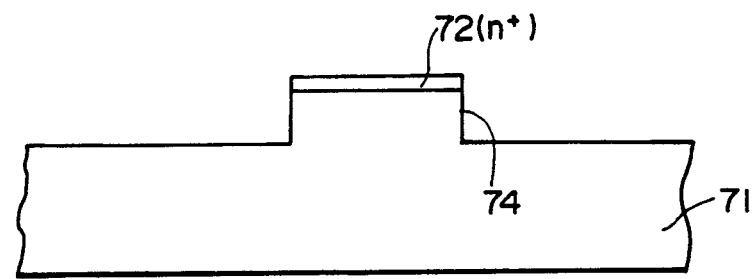
FIGS. 7A to 7G are schematic sectional views showing successive different steps of a still further process of manufacturing a vertical channel FET according to a fourth preferred embodiment of the present invention.

(A) First, similarly as in the third embodiment described above, an n+-type source 72 is formed on a front surface of a semiconductor substrate 71 which is to make an SOI layer 71a later and then the front surface of the semiconductor substrate 71 is selectively etched suitably deeper than the source 72 to form a groove 74. FIG. 7A shows a condition after formation of the groove 74.

Figure 7B:
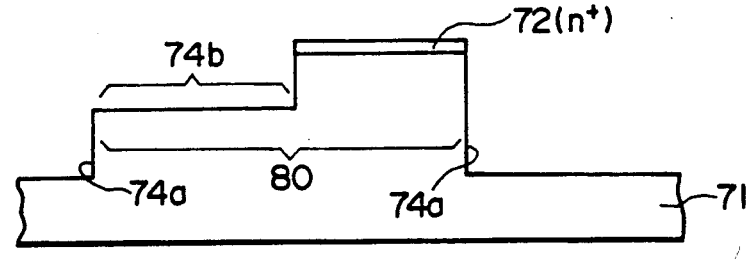

(B) Subsequently, the front surface of the semiconductor substrate 71 is selectively etched suitably deeper than the groove 74 to form another groove 74a. In this instance, the groove 74a is formed at a displaced position such that an upwardly directed stepped portion 74b may be formed on one side of an FET formation region 80. The stepped portion 74b will later make a leading out region form a source electrode. It is to be noted that, in this instance, another stepped portion need not be formed on the other side of the FET formation region 80. FIG. 7B shows a condition after formation of the stepped 74b.

Figure 7C:
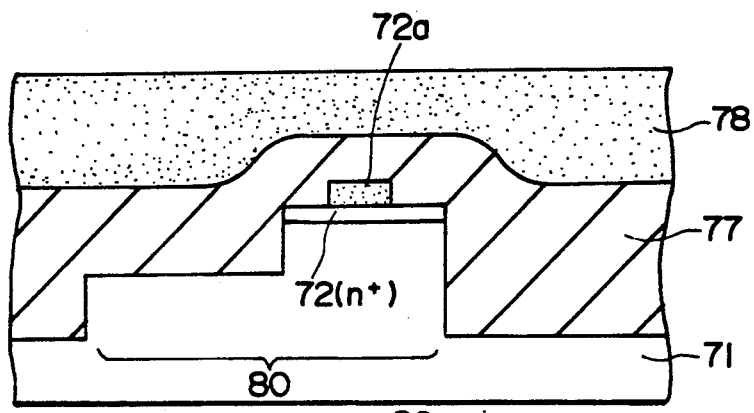

(C) Subsequently, a source electrode 72a is formed on the source 72, and an insulating film 77 is formed on the semiconductor substrate 71, and then a polycrystal silicon layer 79 for cladding of wafer is formed as shown in FIG. 7C.

Figure 7D:
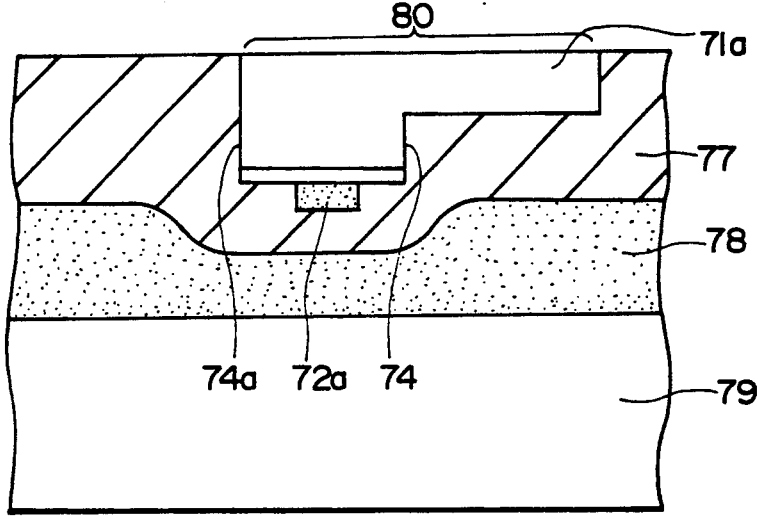

(D) Then, another semiconductor substrate 79 is clad to a front surface of the polycrystal silicon layer 78 as shown in FIG. 7D, and then a rear surface of the semiconductor substrate 71 is polished to obtain an SOI layer 71a. A surface obtained by such polishing makes a front surface of the SOI layer 71a.

Figure 7E:
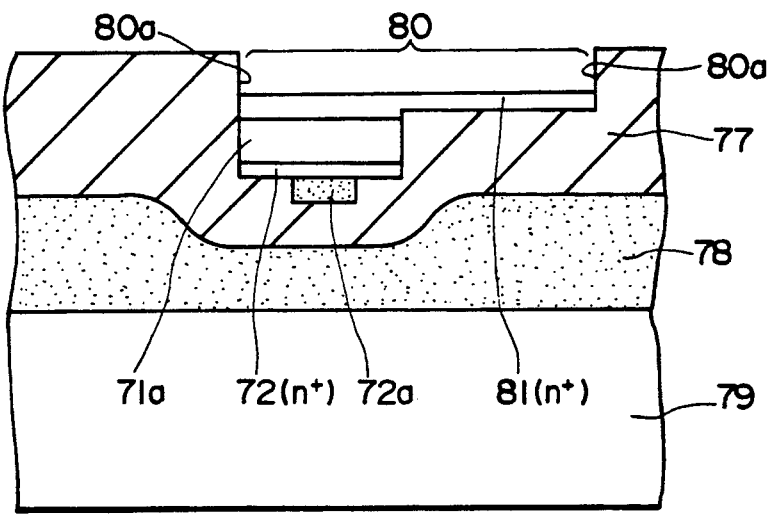

(E) Subsequently, the front surface of the SOI layer 71a is etched by a predetermined depth to form a stepped portion 80a between the insulating film 77 and the front surface of the SOI layer 71a as shown in FIG. 7E and after then, an n+-type source 81 is formed by doping of an n-type impurity into the SOI layer 71a and the semiconductor substrate 71.

Figure 7F:
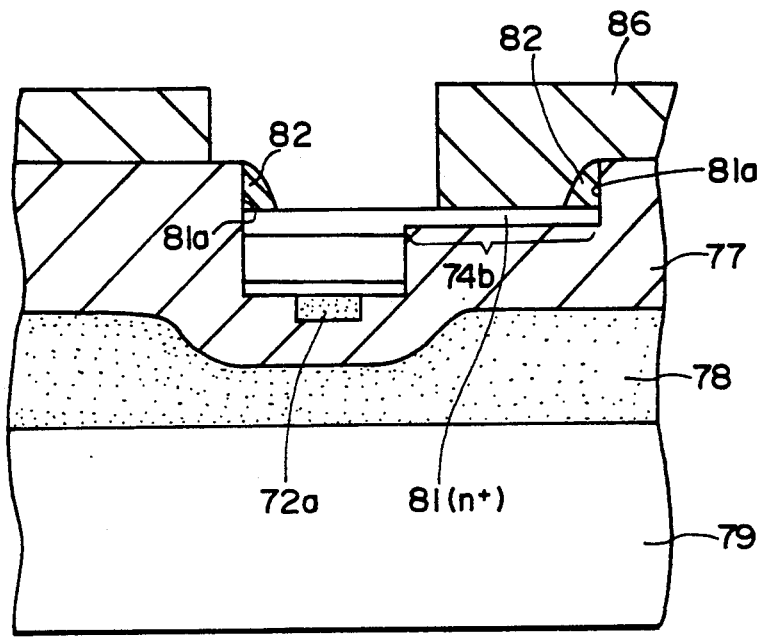

(F) After then, a side wall 82 made of an insulating substance such as, for example, $SiO_2$ is formed on the stepped portion 81a, and the stepped portion 74b formed at the step shown in FIG. 7B is masked in a covered condition with a resist film 86. The resist film 86 is formed so as to prevent a portion from which an electrode of the drain 72 is to be led out from being removed at at next etching step G. FIG. 7F shows a condition after formation of the resist film 86.

Figure 7G:
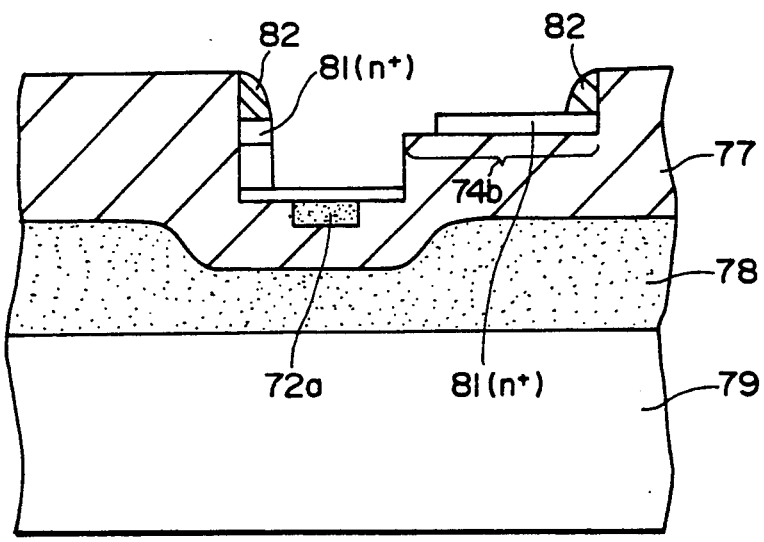
Figure 8A:
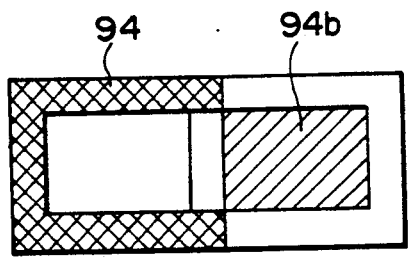
FIGS. 8A and 8B are a schematic plan view and a perspective view, respectively, showing a vertical channel FET in a condition wherein a channel portion is formed and then a resist film is removed in the manufacturing process shown in FIGS. 7A to 7G.
Figure 8B:
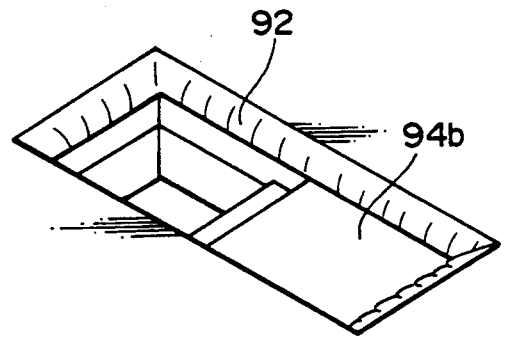

(G) After then, the SOI layer 71a is etched using the resist film 86 and the side wall 82 as a mask to form a thin, vertically directed channel portion. FIGS. 7G, 8A and 8B show conditions after removal of the resist film 86 after formation of a channel portion.

Then, though not shown, a gate insulating film, a gate electrode and a drain electrode are formed in a similar manner as in the third embodiment described hereinabove.

According to such process of manufacturing a vertical channel FET as described above, the thickness of the side wall 82 determines a thickness of a channel portion, and this can be substantially controlled in accordance with a height of the stepped portion 81a. Accordingly, the thickness of the channel portion can be reduced beyond a limit of photo-lithography.

Then, by forming the stepped portion 74b on the portion, the portion can be assured as a portion at which a drain electrode can be formed. Accordingly, the area of a region in which a source electrode can be formed can be increased comparing with that of the third embodiment described hereinabove. It is to be noted that the shape of the channel as viewed from above presents a channel shape and accordingly the present embodiment is different also in this regard from the third embodiment described hereinabove wherein the channel presents a ring-like shape.

It is to be noted that, while the drain 72 is formed on the lower side and the source 81 is formed on the upper side in the embodiment described above, they may otherwise be formed in the reverse relationship such that the drain 72 is formed on the upper side and the source 81 is formed on the lower side.

Referring now to FIGS. 9 and 10A to 10H, there are shown a still further vertical channel FET and successive different steps of a process of manufacturing such vertical channel FET according to a fifth preferred embodiment of the present invention.

Referring first to FIG. 9, the vertical channel FET shown includes a semiconductor substrate 106, a polycrystal silicon film 105 for cladding of wafer on the semiconductor substrate 106, an insulating film 104 made of $SiO_2$, a drain electrode 103 made of, for example, polycrystal silicon or a metal of a high melting point, and a p-type semiconductor layer 101 having an n-type drain 102 formed on a lower surface thereof. The semiconductor layer 101 is originally formed from a semiconductor layer 101 and is obtained by reducing the thickness of the semiconductor layer 101 by etching of a rear surface thereof.

An n+-type source 107 is formed on an upper surface of the semiconductor layer 101, and a gate insulating film 108 is formed on a peripheral surface of the semiconductor layer 101. A gate electrode 109 made of polycrystal silicon is formed on a peripheral surface of the gate insulating film 108, and a source electrode 110 made of, for example, polycrystal silicon or a metal of a high melting point is formed on the source 107.

The vertical channel FET is constructed such that the source electrode 110 and the drain electrode 103 are formed on the upper and lower sides of the semiconductor layer 101 as an SOI layer, and a vertical channel is formed in the semiconductor layer 101. Accordingly, the occupied area of the FET can be reduced.

Then, the gate length can be defined by a thickness of the semiconductor layer 101 as an SOI layer or a vertical distribution in impurity concentration in the thickness, and such gate length can be reduced beyond a limit of photo-lithography.

Subsequently, successive different steps of a process of manufacturing such vertical channel FET shown in FIG. 9 will be described with reference to FIGS. 10A to 10H.

(A) First, an n+-type drain 102 is formed on a front surface of a p-type semiconductor substrate 101, which is to make an SOI layer, as shown in FIG. 10A by selective ion implantation of an impurity. It is to be noted that reference character 101*a* denotes a front face of the semiconductor substrate 101, and 101*b* a rear surface of the semiconductor substrate 101.

(B) Subsequently, a drain electrode 103 is formed on the drain 102, and an insulating film 104 is formed on a front surface of the semiconductor substrate 101 by a CVD method, whereafter a polycrystal silicon layer 105 for cladding of semiconductor wafer is formed on the insulating film 104. FIG. 10B shows a condition after formation of the polycrystal silicon layer 105.

Figure 10C:
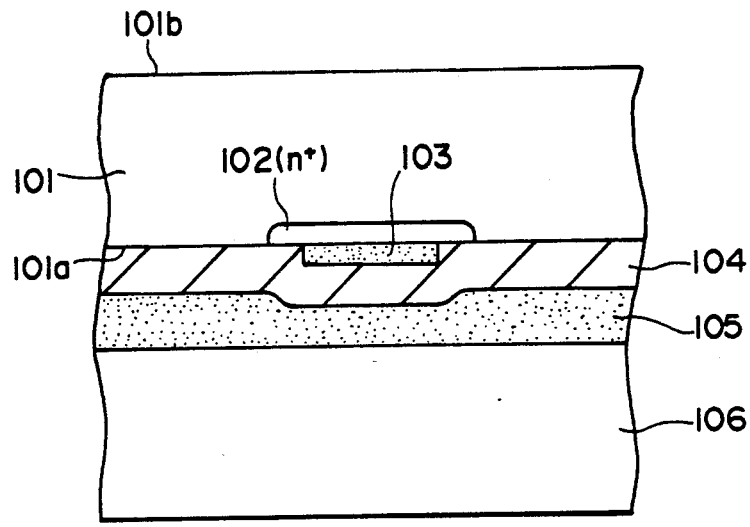

(C) Then, the semiconductor substrate 101 is clad at the polycrystal silicon layer 105 for cladding of semiconductor layer thereon to a front surface of another semiconductor substrate 106 as shown in FIG. 10C.

Figure 10D:
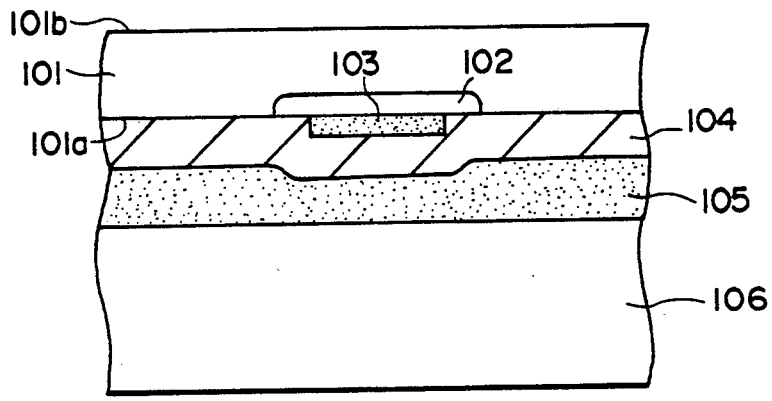

(D) Subsequently, the rear surface of the semiconductor substrate 101 is etched back to obtain a semiconductor layer (SOI) 101 of a predetermined thickness as shown in FIG. 10D.

Figure 10E:
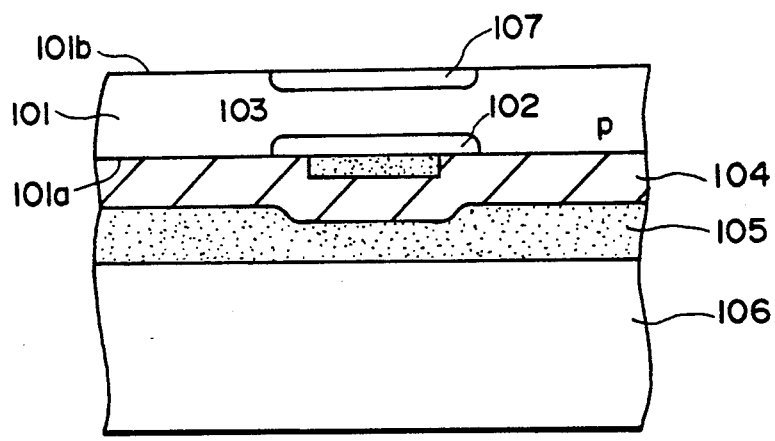
Figure 10F:
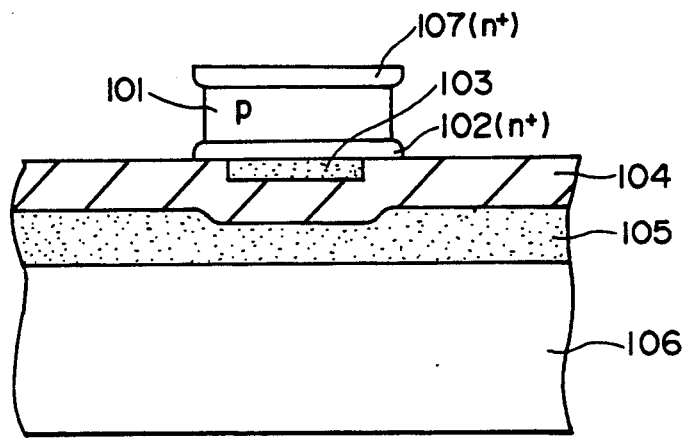

(E) Then, an n+-type source 107 is formed on a front surface portion of the rear surface 101*b* of the semiconductor layer 101 as shown in FIG. 10E by selective ion implantation of an impurity.

(F) Subsequently, a portion of the semiconductor layer 101 other than a portion between the source 107 and the drain 102 is removed by selective etching.

Figure 10G:
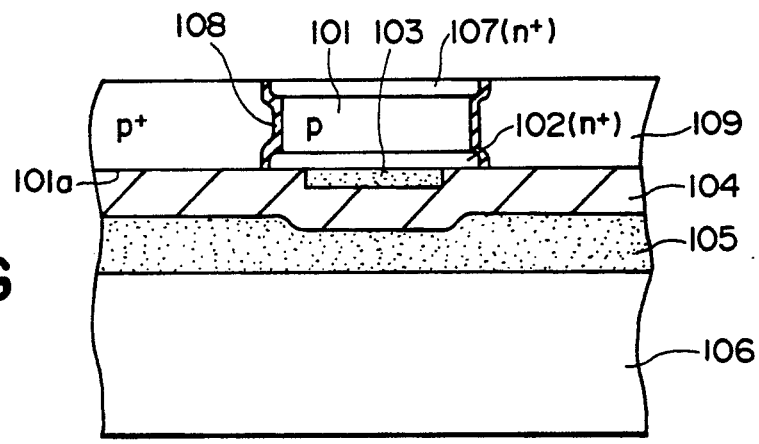

(G) Subsequently, an outer periphery of the semiconductor layer 101 is oxidized by heating to form a gate insulating film 108, and a p+-type polycrystal silicon layer 109 is formed on the outer side of the gate insulating film 108 by a CVD method. FIG. 10G shows a condition after formation of the polycrystal silicon layer 109.

Figure 10H:
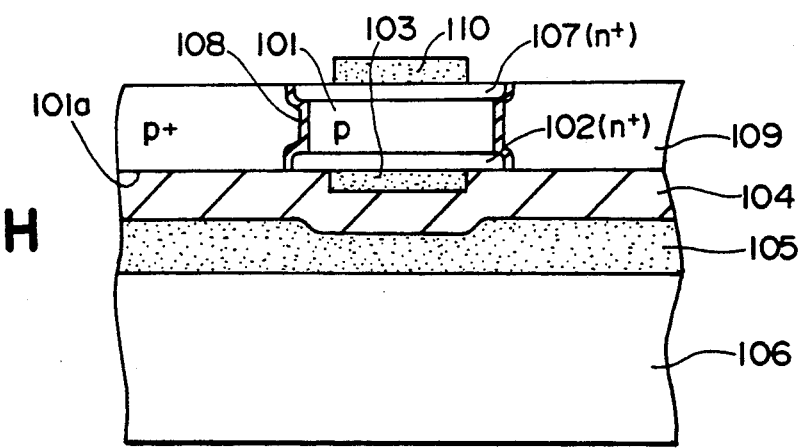

(H) After then, a source electrode 110 is formed on the source 107 as shown in FIG. 10H.

It is to be noted that the drain 102 and source 107 may be formed not by selective ion implantation of an impurity into the semiconductor layer 101 but by redistribution by diffusion into the semiconductor layer 101 of impurities in the source electrode 110 and drain electrode 103 formed on the upper and lower faces of the semiconductor layer 101 and made of polycrystal silicon.

Further, while the vertical channel FET shown in FIG. 9 has such a structure that the entire peripheral surface of the semiconductor layer 101 surrounded by the gate insulating film 108 is covered with the polycrystal silicon 109 as a gate electrode, it is not always necessary to employ such structure, and the peripheral surface of the semiconductor layer 101 may be replaced partially by an insulating film and the polycrystal silicon layer 109 as a gate electrode may be disposed at the remaining portion.

Further, while the drain 102 is located on the lower side and the source 7 is located on the upper side in the vertical channel FET shown in FIG. 9, otherwise the reverse arrangement may be employed such that the source 107 is formed on the lower side and the drain 102 is formed on the upper side.

Figure 11:
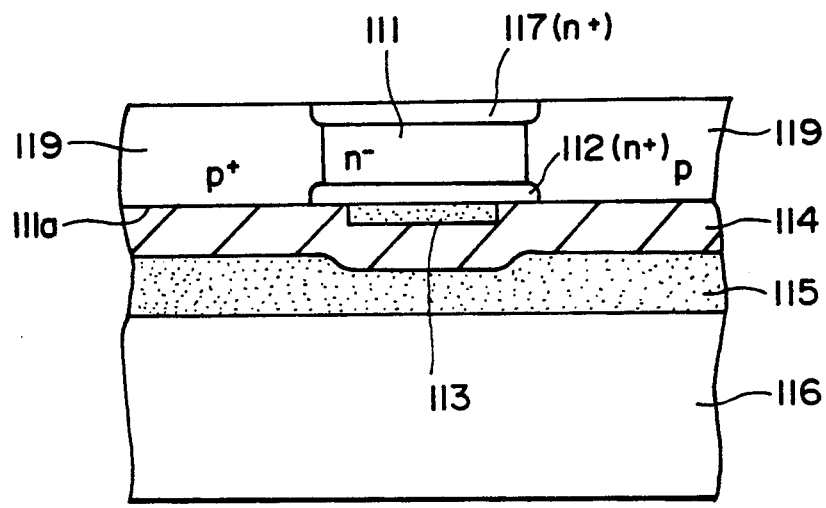
FIG. 11 is a schematic sectional view of a vertical channel FET applied to a junction FET according to the present invention.

Referring now to FIG. 11, there is shown in schematic sectional view a vertical channel FET applied to an SIT (static induction transistor) (J-FET=junction field effect transistor) according to a sixth preferred embodiment of the present invention.

In this instance, the vertical channel FET includes no gate insulating film and a semiconductor layer 111 thereof must be of the n−-type reverse to that of a polycrystal silicon 119 as a gate electrode on the outer side.

Figure 12:
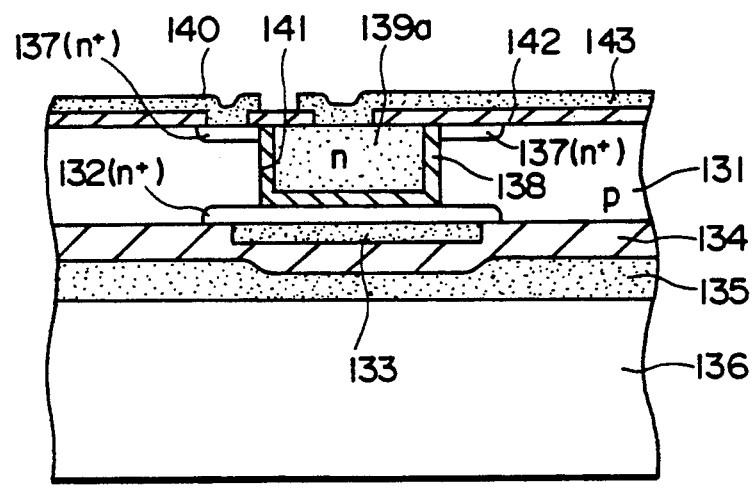
FIG. 12 is a schematic sectional view of a yet further vertical channel FET according to the present invention.

Referring now to FIG. 12, there is shown another vertical channel FET according to a seventh preferred embodiment of the present invention. The vertical channel FET shown includes a semiconductor substrate 136, a polycrystal silicon layer 135 for cladding, an insulating film 134 made of $SiO_2$, a drain electrode 133, an n+-type drain 132, a p-type semiconductor layer 131 as an SOI layer, and an n+-type source 137. A groove 141 is formed by selective etching of the semiconductor layer 131 and has a depth smaller than a thickness of the semiconductor layer 131 by an amount equal to the depth of the n+-type drain 132.

A gate insulating film 138 is formed by heating of an inner surface of the groove 141, and an n-type polycrystal silicon layer 139*a* is filled in the groove 141 and makes a gate electrode. An insulating film 142 is formed on the semiconductor layer 131 and gate electrode 139*a*, and a source electrode 140 is held in contact with the source 137 through a contact hole in the insulating film 142 while a gate wiring layer 143 extends through another contact hole of the insulating film 142 and held in contact with the gate electrode 139*a*. The gate wiring layer 143 and the source electrode 140 are both made of, for example, polycrystal silicon or a metal and formed at a time in a manufacturing process.

The present vertical channel FET is manufactured such that a groove 141 is formed in a semiconductor layer 131 and an inner surface of the groove 141 is oxidized to form a gate insulating film 138, and then the groove 141 is filled with an n-type polycrystal silicon to form a gate electrode 139*a*, whereafter a vertical channel having a ring-like shape is formed around the gate electrode 139*a*.

According to such vertical channel FET, the gate length is determined by a thickness of the semiconductor layer 131 while the gate width is determined by a circumferential length of the groove 141 and the gate thickness is determined by a size of the groove 141, and accordingly, the vertical channel FET can be formed with a high degree of accuracy.

Figure 13A:
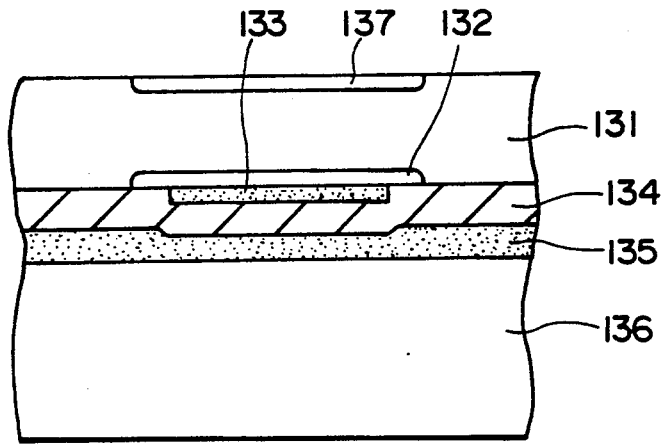
FIGS. 13A to 13C are schematic sectional views showing different steps of a process of manufacturing the vertical channel FET shown in FIG. 12 according to a seventh preferred embodiment of the present invention.
Figure 13B:
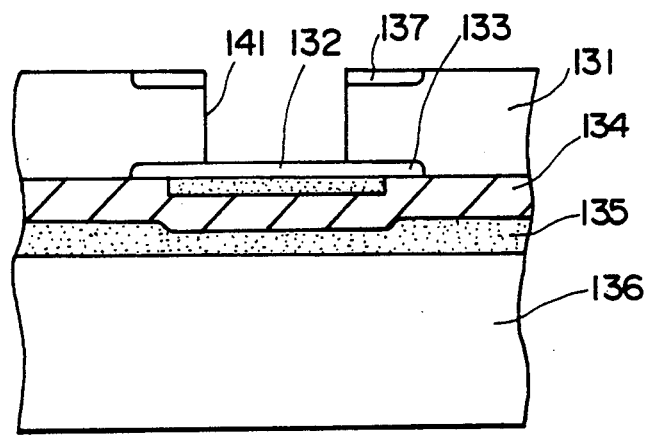
Figure 13C:
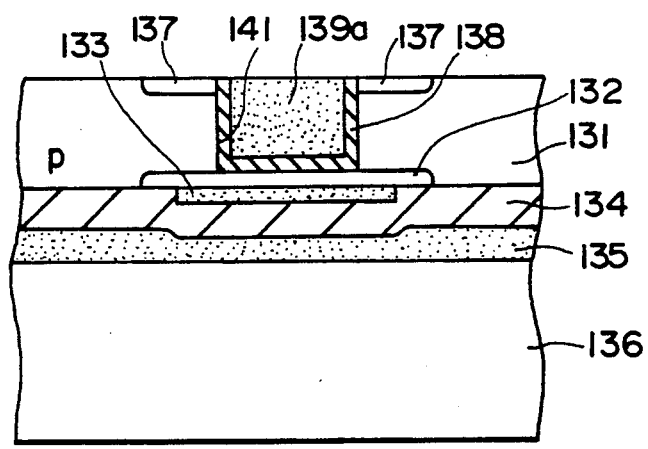

Referring now to FIGS. 13A to 13C, there are shown successive different steps of a process of manufacturing the vertical channel FET shown in FIG. 12.

(A) According to the present manufacturing process, such a condition wherein a source 137 is formed on a front surface of a semiconductor layer 131 as shown in FIG. 13A is made by way of such steps as shown in FIGS. 10A to 10E.

(B) Subsequently, the semiconductor layer 131 is selectively etched to form a groove 141 as shown in FIG. 13B.

(C) Then, a gate insulating film 138 is formed on an inner surface of the groove 141 by oxidation by heating, and after then, the groove 141 is filled up with a gate electrode 139a of polycrystal silicon. FIG. 13C shows a condition after formation of the gate electrode 139a.

After then, such an FET as shown in FIG. 12 is obtained by way of the steps of formation of an insulating film 142, formation of a contact hole by selective etching of the insulating film 142 and formation of an electrode.

Figure 14:
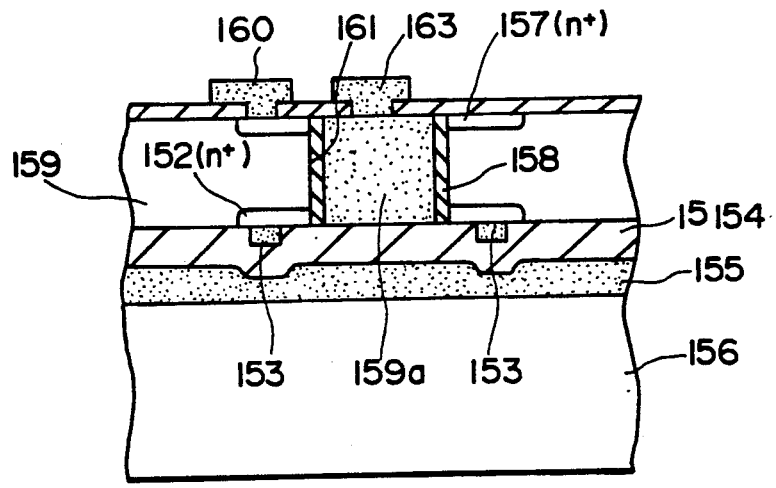
FIG. 14 is a schematic sectional view of a first modification to the vertical channel FET shown in FIG. 12.

It is to be noted that, while the vertical channel FET shown in FIG. 12 is constituted such that the depth of the groove 141 is greater than the thickness of the semiconductor substrate 131, it may otherwise be equal to the thickness of the semiconductor layer 131 as in the case of an FET shown in FIG. 14 which is a first modification to the vertical channel FET shown in FIG. 12.

Figure 15:
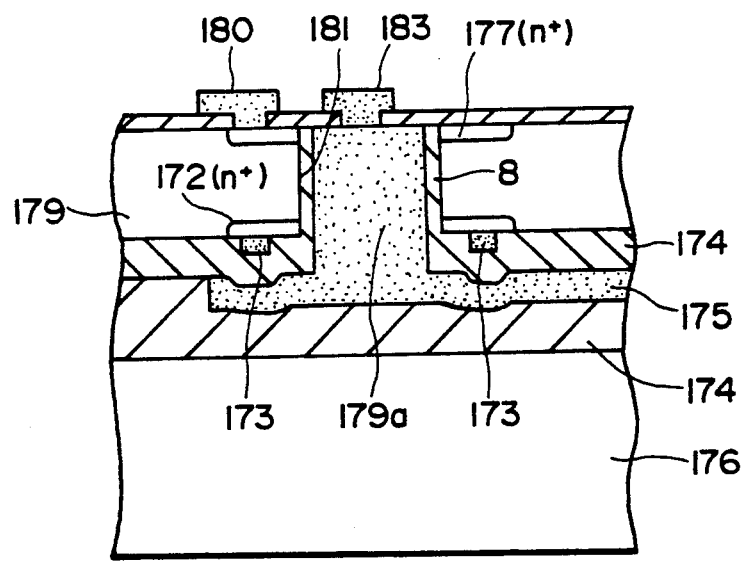
FIG. 15 is a schematic sectional view of a second modification to the vertical channel FET shown in FIG. 12.

Further, while the FET shown in FIG. 12 is constituted such that the gate wire is formed on the upper side of the semiconductor layer 131, it need not necessarily have such construction, and the gate wire may otherwise be formed on the lower side of the semiconductor layer 131. When such gate wire is to be formed on the lower side of the semiconductor layer 131, a gate wire 175 should be formed in an insulating film 154 by an ordinary processing technique before cladding. FIG. 15 shows such modification to the vertical channel FET shown in FIG. 12.

It is to be noted that the number of wires to be formed in the insulating film 174 before cladding may be increased in accordance with the necessity to achieve high integration of an integrated circuit.

Figure 16:
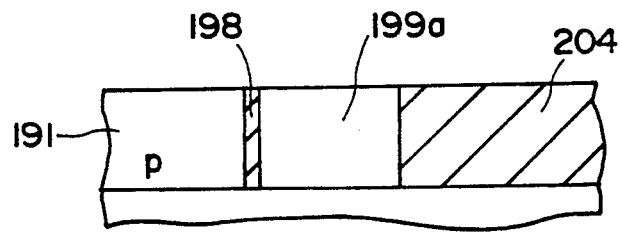
FIG. 16 is a schematic sectional view of a third modification to the vertical channel FET shown in FIG. 12.

Further, while the vertical channel FET shown in FIG. 12 is constituted such that a entire peripheral portion (360 degrees) of the gate electrode 139a made of polycrystal silicon and filling up the groove 141 makes a channel, it may otherwise be modified such that, as shown in FIG. 16, one side of a gate electrode 199a is filled up with an insulating film 204 while only the other side of the gate electrode 1991 makes a channel. Where it is not required that a channel has a great width, such structure as described just above may be employed.

Having now fully described the invention, it will be apparent to one of ordinary skill in the art that many changes and modifications can be made thereto without departing from the spirit and scope of the invention as set forth herein.

What is claimed is:

1. A process for manufacturing a vertical channel field effect transistor comprising the steps of:

forming a drain layer on a first semiconductor substrate;
   selectively etching the drain layer and the first semiconductor substrate to form a first groove;
   selectively etching the first semiconductor substrate and the drain layer to form a second groove;
   forming a drain electrode on the drain layer;
   applying an insulating film onto the drain layer and the first and second grooves such that the first and second grooves are filled by the insulating film;
   forming a polycrystal silicon layer over the insulating film;
   cladding a front surface of the polycrystal silicon layer to a second substrate;
   polishing a rear surface of the first semiconductor substrate to expose portions of the insulating film;
   doping the exposed substrate to form a source;
   selectively etching the exposed substrate to form a third groove; and
   filling the third groove polycrystalline silicon a form a gate electrode.

2. A process for manufacturing a vertical channel field of effect transistor comprising the steps of:

forming a drain layer on at least a portion of a front surface of a first semiconductor substrate;
   forming a first insulating film on the drain layer;
   etching the front surface of the first semiconductor substrate to form a first groove using the first insulating film as a mask;
   forming a second insulating film over the surface of the first semiconductor substrate and the first insulating film;
   etching the second insulating film to form a first side wall on a side surface of the groove;
   etching the first semiconductor substrate using the first side wall as a mask;
   forming a third insulating film on the front surface of the first semiconductor substrate;
   forming a polycrystal silicon layer on the third insulating film;
   cladding the polycrystal silicon layer to a second semiconductor substrate;
   polishing a rear surface of the first semiconductor substrate to expose the third insulating film;
   doping the exposed surface of the first semiconductor substrate to form a source region;
   forming a second side wall above the source region;
   selectively etching the first semiconductor substrate using the second side wall as mask to form a vertical channel;
   forming a gate insulating film on said vertical channel;
   forming a gate electrode in the vertical channel;
   selectively etching the second side wall to from an opening; and
   forming a drain electrode in the opening on said drain region.

* * * * *